United States Patent
Cheng

(10) Patent No.: US 12,222,385 B2
(45) Date of Patent: Feb. 11, 2025

(54) TESTING METHOD AND TESTING SYSTEM

(71) Applicant: CHANGXIN MEMORY TECHNOLOGIES, INC., Anhui (CN)

(72) Inventor: Yu-Ting Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 815 days.

(21) Appl. No.: 17/445,946

(22) Filed: Aug. 25, 2021

(65) Prior Publication Data
US 2022/0043051 A1 Feb. 10, 2022

Related U.S. Application Data

(63) Continuation of application No. PCT/CN2021/099429, filed on Jun. 10, 2021.

(30) Foreign Application Priority Data

Aug. 6, 2020 (CN) .......................... 202010782416.9

(51) Int. Cl.
*G01R 31/28* (2006.01)

(52) U.S. Cl.
CPC .............................. *G01R 31/2831* (2013.01)

(58) Field of Classification Search
None
See application file for complete search history.

(56) References Cited

U.S. PATENT DOCUMENTS

| | | | |
|---|---|---|---|
| 8,627,251 B2 | 1/2014 | Chen | |
| 2007/0211932 A1* | 9/2007 | Lee | G06T 7/0004 382/145 |
| 2008/0169831 A1 | 7/2008 | Lu | |
| 2009/0302875 A1 | 12/2009 | Lu | |
| 2011/0109343 A1 | 5/2011 | Matsuda | |
| 2013/0152032 A1* | 6/2013 | Wei | G06F 30/398 716/112 |
| 2015/0051859 A1* | 2/2015 | Chien | G01R 31/2846 702/81 |
| 2017/0356955 A1* | 12/2017 | Sumikawa | G01R 31/2894 |

FOREIGN PATENT DOCUMENTS

| | | |
|---|---|---|
| CN | 103346104 A | 10/2013 |
| CN | 104103541 A | 10/2014 |
| CN | 108807212 A | 11/2018 |

* cited by examiner

*Primary Examiner* — Roy Y Yi
(74) *Attorney, Agent, or Firm* — SYNCODA LLC; Feng Ma

(57) ABSTRACT

A testing method includes: a wafer under test is detected based on a pre-set test region to obtain detection results of a plurality of chips in the wafer under test; a discrete point distribution diagram of the detection results of the plurality of chips are obtained, a discrete point in the discrete point distribution diagram being used for representing a position of an abnormal chip in the wafer under test; the discrete point distribution diagram is divided into a plurality of test regions based on graphic distribution characteristics in the pre-set test region, and a test result distribution diagram for representing graphic characteristics of the discrete point distribution diagram is obtained; a correlation between the test result distribution diagram and the graphic distribution characteristics in the pre-set test region is obtained; and a test result of the wafer under test is obtained based on the correlation.

9 Claims, 9 Drawing Sheets

| Test data sorting (ascending order) | 1 | 2 | 3 | 4 | 5 | ... | n | ... |
|---|---|---|---|---|---|---|---|---|
| Test data value Q | N1 | N2 | N3 | N4 | N5 | ... | Nn | ... |

Q1 (column 3), Q2 (column 5)

Judgement standard: $Q \leq Q_1 - 1.5*Iqr$ or $Q \geq Q_2 + 1.5*Iqr$

FIG. 2

| Test data sorting (descending order) | 1 | 2 | 3 | 4 | 5 | ... | n | ... |
|---|---|---|---|---|---|---|---|---|
| Test data value Q | M1 | M2 | M3 | M4 | M5 | ... | Mn | ... |

Judgement standard: $Q \leq Q3-1.5*Iqr$ or $Q \geq Q4+1.5*Iqr$

FIG. 3

TESTING METHOD AND TESTING SYSTEM

CROSS-REFERENCE TO RELATED APPLICATIONS

The present application is a continuation of International Application No. PCT/CN2021/099429 filed on Jun. 10, 2021, which claims priority to Chinese Patent Application No. 202010782416.9 filed on Aug. 6, 2020. The disclosures of these applications are hereby incorporated by reference in their entireties.

BACKGROUND

A manufacturing process of an integrated circuit may usually include a wafer manufacturing process, wafer testing (or Chip Probe (CP)), wafer packaging and Final Test (FT). CP and FT are important aspects in the production process of the integrated circuit. The purpose of CP is to pick out a damaged die(s), to save the cost for packaging a waste chip(s), and a CP result is obtained with relatively high credibility under reasonable cost control.

SUMMARY

The present disclosure relates generally to the technical field of semiconductor testing, and more specifically to a testing method and a testing system.

Various embodiments of the present disclosure provide a testing method and a testing system.

The embodiments of the present disclosure provide a testing method, which includes that: a wafer under test is detected based on a pre-set test region, to obtain detection results of a plurality of chips in the wafer under test; a discrete point distribution diagram of the detection results of the plurality of chips in the wafer under test is obtained, an discrete point in the discrete point distribution diagram being used for representing a position of an abnormal chip in the wafer under test; the discrete point distribution diagram is divided into a plurality of test regions based on graphic distribution characteristics in the pre-set test region, and a test result distribution diagram is obtained, the test result distribution diagram being used for representing graphic characteristics of the discrete point distribution diagram; a correlation between the test result distribution diagram and the graphic distribution characteristics in the pre-set test region is obtained; and a test result of the wafer under test is obtained based on the correlation.

The embodiments of the present disclosure also provide a testing system, which may include a wafer under test, a detection machine and a processing device; the detection machine is configured to detect the wafer under test based on a pre-set test region, obtaining the detection results of a plurality of chips in the wafer under test, and uploading the detection results to the processing device; the processing device is configured to obtain a discrete point distribution diagram of the detection results of the plurality of chips in the wafer under test, a discrete point in the discrete point distribution diagram being used for representing a position of an abnormal chip in the wafer under test; and the processing device is further configured to divide the discrete point distribution diagram into a plurality of test regions based on graphic distribution characteristics in the pre-set test region, obtain a test result distribution diagram, the test result distribution diagram being used for representing graphic characteristics of the discrete point distribution diagram, obtain a correlation between the test result distribution diagram and the graphic distribution characteristics in the pre-set test region, and obtain a test result of the wafer under test based on the correlation.

BRIEF DESCRIPTION OF THE DRAWINGS

FIG. 2 illustrates a first schematic diagram of a sorting manner provided by an embodiment of the present disclosure;

FIG. 3 illustrates a second schematic diagram of a sorting manner provided by an embodiment of the present disclosure;

DETAILED DESCRIPTION

The inventor of the present disclosure has recognized that in current CP and FT, in order to effectively execute a testing process, only chips with relatively low yield are screened out usually. Moreover, for some relatively non-obvious problems in the testing process, identification omission is caused easily, and meanwhile, the phenomenon is not only limited to the chips with low yield.

In order to solve the problems, an embodiment of the present disclosure provides a testing method, which includes that: a wafer under test is detected based on a pre-set test region, to obtain detection results of a plurality of chips in the wafer under test; a discrete point distribution diagram of the detection results of the plurality of chips in the wafer under test is obtained, a discrete point in the discrete point distribution diagram being used for representing a position of an abnormal chip in the wafer under test; the discrete point distribution diagram is divided into a plurality of test regions based on graphic distribution characteristics in the pre-set test region, and a test result distribution diagram is obtained, the test result distribution diagram being used for representing graphic characteristics of the discrete point distribution diagram; a correlation between the test result distribution diagram and the graphic distribution characteristics in the pre-set test region is obtained; and a test result of the wafer under test is obtained based on the correlation.

In order to enable purposes, technical schemes and advantages of the embodiments of the present disclosure to be more clearly, the various embodiments of the present disclosure are described in detail in combination with figures below. However, it can be understood by those of ordinary skill in the art that in order to enable a reader to understand the present disclosure better, many technical details are provided in the various embodiments of the present disclosure. But, even if these technical details and a variety of change and modifications based on the various embodiments below do not exist, the technical schemes required to be protected by the present disclosure may also be realized. In order to describe conveniently, the various embodiments below are divided; the specific implementation modes of the present disclosure should not be any limited; and the various embodiments may be mutually combined and mutually referred on the premise of no contradiction.

Figure 1:
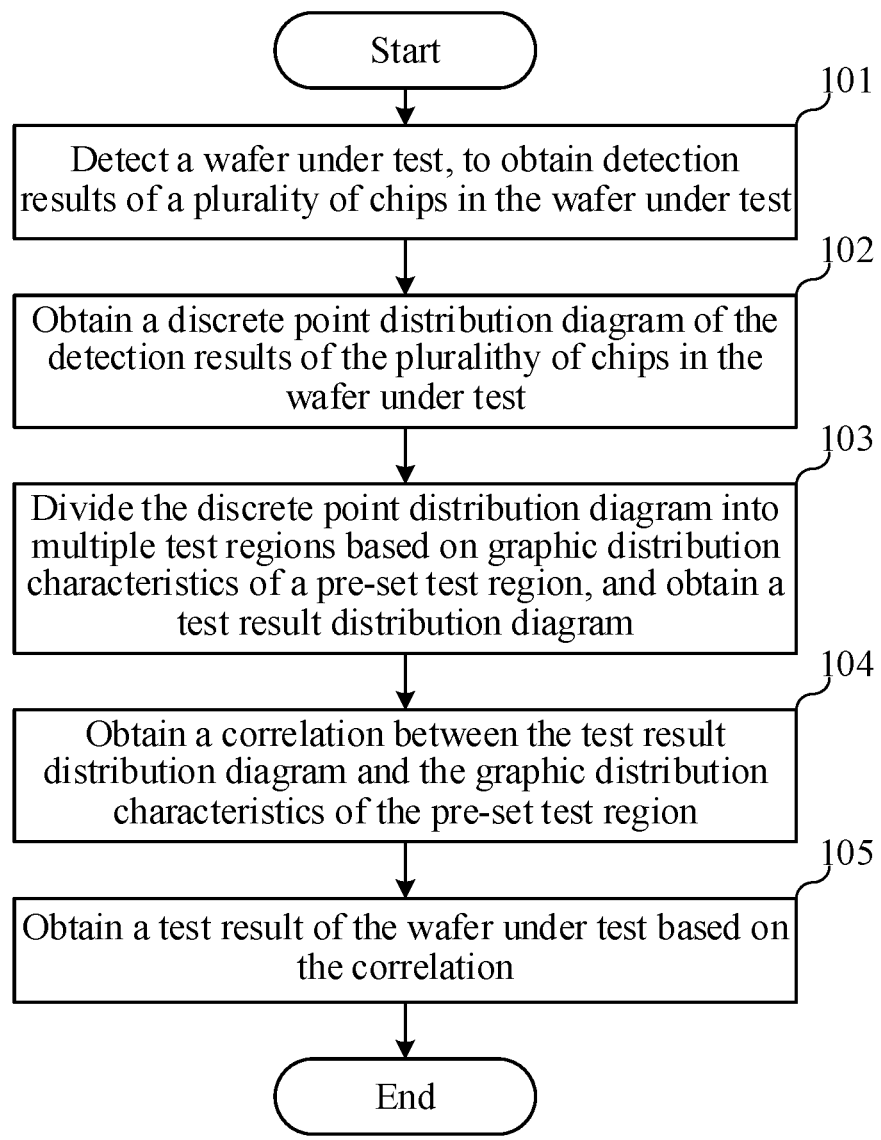
FIG. 1 illustrates a flowchart of a testing method provided by an embodiment of the present disclosure.

FIG. 1 illustrates a flowchart corresponding to a testing method provided by the embodiments of the present disclosure; and the testing method in the embodiments is specifically described below.

Referring to FIG. 1, the testing method may include: Step 101 to Step 105, specifically as follows.

At S101, a wafer under test is detected, to obtain detection results of a plurality of chips in the wafer under test.

Specifically, the wafer under test is detected based on the pre-set test region, so that the detection results of the plurality of chips in the wafer under test are obtained. Herein, the pre-set test region is a set of various sites where the wafer under test is required to be subjected to chip detection; and the sites are used for representing the positions of the chips in the wafer under test. Namely, the plurality of chips in the wafer under test are detected according to the pre-set detection sites, to obtain the detection results of the plurality of chips in the wafer under test.

It should be noted that the pre-set test region is arranged to be adapted to the wafer under test; namely, for wafers under test of different models, sites included in the pre-set test region are different. Namely, the testing method provided by the embodiments is suitable for detection of wafers of different models.

It should be noted that in other embodiments, if the detection results of the plurality of chips of the wafer are not suitable for subsequent statistical analysis, the detection results are required to be converted to the detection results suitable for subsequent statistical analysis; in other embodiments, a pre-treatment process on the detection results is also included; the wafer which is initially identified as being disqualified, is directly picked out to increase the efficiency of the subsequent statistical analysis.

At S102, the discrete point distribution diagram of the detection results of the plurality of chips in the wafer under test is obtained.

Specifically, the discrete point distribution diagram of the detection results of the plurality of chips in the wafer under test is obtained; the discrete point distribution diagram is used for ensuring the positions and the number of discrete points in the wafer under test; and a discrete point is used for representing a position of an abnormal chip in the wafer under test.

It should be noted that the testing method provided by the embodiments is suitable for category-type detection results, and also suitable for data-type detection results; the category-type detection results are directly used for indicating whether the plurality of chips under test in the wafer under test are normal chips or abnormal chips; and the data-type detection results are used for indicating the specific test numerical values of the plurality of chips under test in the wafer under test.

In one example, when the detection results are of a category type, the position distribution diagram of the abnormal chips in the wafer under test is a discrete point distribution diagram of the detection results of the plurality of chips in the wafer under test.

In one example, the operation that the discrete point distribution diagram of the detection results of the plurality of chips in the wafer under test is obtained when the detection results are of a data type includes that: for each chip under test in the wafer under test, all specific test numerical values corresponding to the chip under test are obtained; whether the chip under test is a normal chip or an abnormal chip is judged based on the specific test numerical values; and a position distribution diagram of abnormal chips in the wafer under test is obtained.

The embodiments provide two methods for judging whether a chip under test is a normal chip or an abnormal chip based on specific test numerical values.

The first method: referring to FIG. 2, all the specific test numerical values Q are arranged in an ascending order; according to the sorting order of 1 to n, the specific test numerical values Q are gradually increased; any two detection results are taken as a first detection result Q1 and a second detection result Q2 respectively from the ascending order arrangement; furthermore, the second detection result Q2 is greater than the first detection result Q1; the detection results corresponding to the chips under test as discrete points at least include a pre-set number of abnormal test numerical values; when a specific test numerical value Q satisfies that: $Q \leq Q1-1.5*Iqr$ or $Q \geq Q2+1.5*Iqr$, the specific test numerical value Q is taken to be a abnormal test numerical values, where Iqr is a quartile deviation of the second detection result Q2 and the first detection result Q1.

In one example, if there are 100 specific test numerical values Q, the first detection result Q1 is sorted at No. 25 and the second detection result Q2 is sorted at No. 75, Iqr is a quartile deviation of the second detection result Q2 and the first detection result Q1, namely Iqr=75−25=50.

The second method: referring to FIG. 3, all the specific test numerical values Q are arranged in a descending order; according to the sorting order of 1 to n, the specific test numerical values Q are gradually decreased; any two detection results are taken as a third detection result Q3 and a fourth detection result Q4 respectively from the descending order arrangement; furthermore, the fourth detection result Q4 is less than the third detection result Q3; the detection results corresponding to the chips under test taken as a discrete point at least include a pre-set number of abnormal test numerical values; when a specific test numerical value Q satisfies that: $Q \leq Q4-1.5*Iqr$ or $Q \geq Q3+1.5*Iqr$, the specific test numerical value Q is an abnormal test numerical value, where Iqr is a quartile deviation of the fourth detection result Q4 is less than the third detection result Q3.

In one example, if there are 100 specific test numerical values Q, the fourth detection result Q4 is sorted at No. 25 and the third detection result Q3 is sorted at No. 75, Iqr is a quartile deviation of the third detection result Q3 and the fourth detection result Q4, namely Iqr=75−25=50.

It should be noted that in the two methods of judging whether a chip under test is a normal chip or an abnormal chip based on the specific test numerical values, the pre-set number of specific numerical values may be set according to the required yield of the wafer; when the yield of the wafer required to be produced is relatively high, the pre-set number of specific numerical values may be set as a relatively small numerical value, so that a chip under test may also be identified as an abnormal chip when only a few abnormal numerical values occur; and, when the yield of the wafer required to be produced is not too high, the pre-set number of specific numerical values may be set as a relatively large numerical value, so that the chip under test is still taken as a normal chip when a certain number of abnormal numerical values occur.

At S103, the discrete point distribution diagram is divided into a plurality of test regions based on the graphic distribution characteristics in the pre-set test region; and the test result distribution diagram is obtained.

Specifically, the discrete point distribution diagram is divided into a plurality of test regions based on the graphic distribution characteristics in the pre-set test region; the test result distribution diagram is obtained; and the test result distribution diagram is used for representing graphic characteristics of the discrete point distribution diagram.

Figure 4:
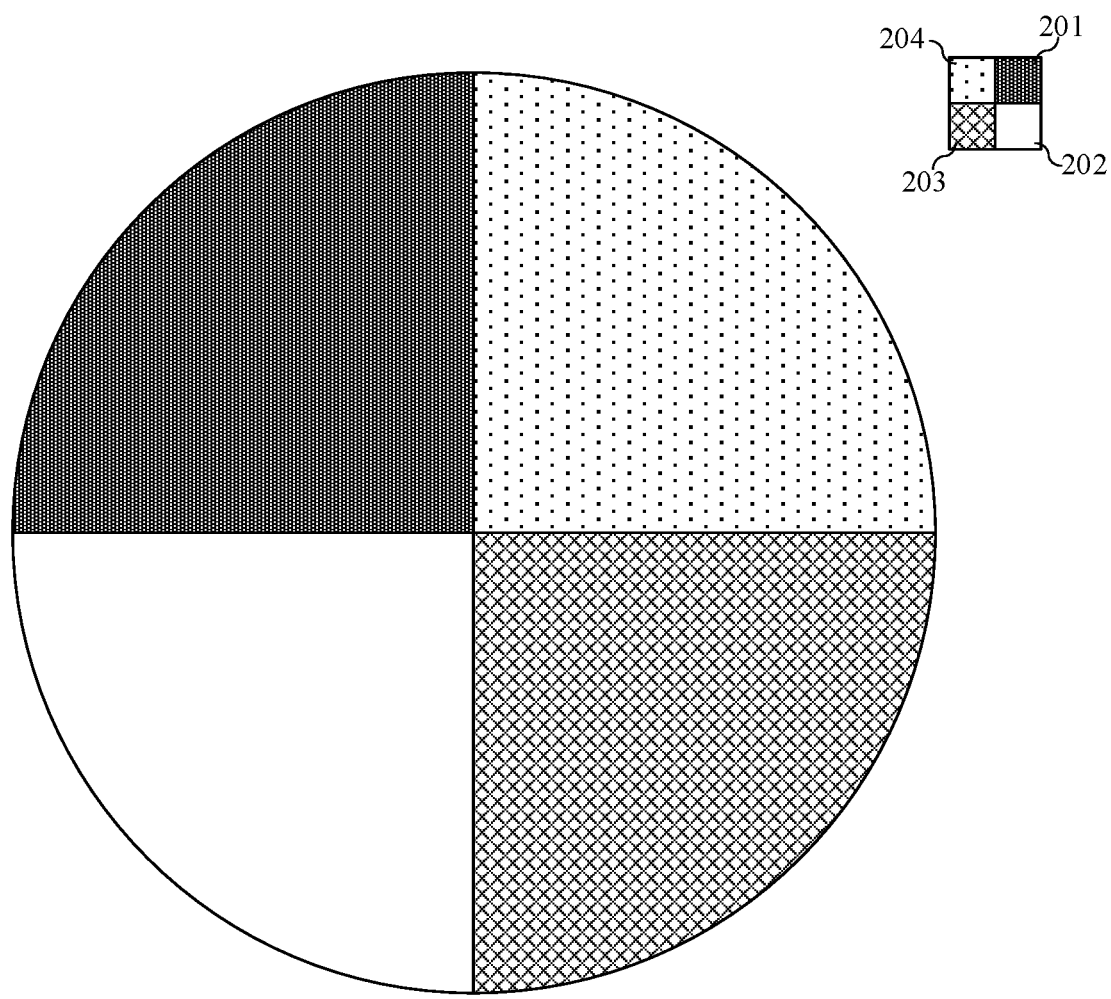
FIG. 4 illustrates a first schematic diagram of a region division manner provided by an embodiment of the present disclosure.

In one example, referring to FIG. 4, the operation that the discrete point distribution diagram is divided into a plurality of test regions based on the graphic distribution characteristics in the pre-set test region includes that: the discrete point distribution diagram is uniformly divided into a first test region 201, a second test region 202, a third test region 203 and a fourth test region 204 based on a crisscross region division manner. Herein, the crisscross point is a circle center of the discrete point distribution diagram, so that the areas of the divided first test region 201, second test region 202, third test region 203 and fourth test region 204 are ensured to be same. The numbers and the position differences of the discrete points in the first test region 201, the second test region 202, the third test region 203 and the fourth test region 204 are determined, and the test result distribution diagram is obtained.

Figure 5:
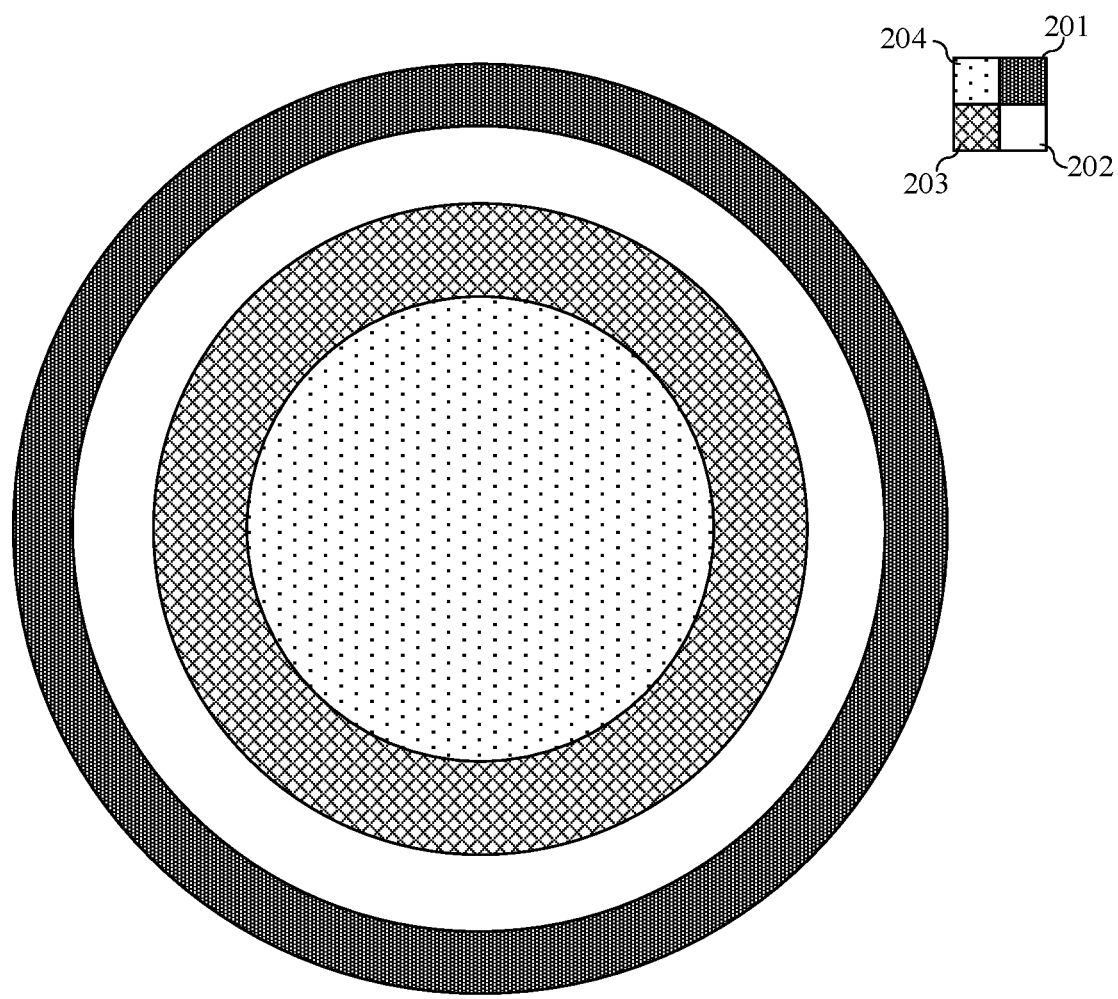
FIG. 5 illustrates a second schematic diagram of a region division manner provided by an embodiment of the present disclosure.

In another example, referring to FIG. 5, the operation that the discrete point distribution diagram is divided into a plurality of test regions based on the graphic distribution characteristics in the pre-set test region includes that: the discrete point distribution diagram is divided into a first test region 201, a second test region 202, a third test region 203 and a fourth test region 204 based on a concentric ring region division manner. Herein, the first test region 201, the second test region 202, the third test region 203 and the fourth test region 204 have the same circle center; moreover, the radius of the inner ring test region is greater than that of the outer ring test region, so that the occupied areas of the first test region 201, the second test region 202, the third test region 203 and the fourth test region 204 are ensured to be same. The numbers and the position differences of the discrete points in the first test region 201, the second test region 202, the third test region 203 and the fourth test region 204 are determined; and the test result distribution diagram is obtained.

Specifically, the operation of determining the numbers and the position differences of the discrete points in the first test region 201, the second test region 202, the third test region 203 and the fourth test region 204 includes that: the number differences of the discrete points in the discrete points in the first test region 201, the second test region 202, the third test region 203 and the fourth test region 204 are determined in a chi-square (X2) test manner. A test result obtained by obtaining the number differences of the discrete points in the first test region 201, the second test region 202, the third test region 203 and the fourth test region 204 in the chi-square test manner has relatively high persuasion.

At step 104, a correlation between the test result distribution diagram and the graphic distribution characteristics in the pre-set test region is obtained.

Specifically, it is judged whether the discrete points in the test result distribution diagram have a same regional concentration phenomenon as the graphic distribution characteristics in the pre-set test region.

Figure 6:
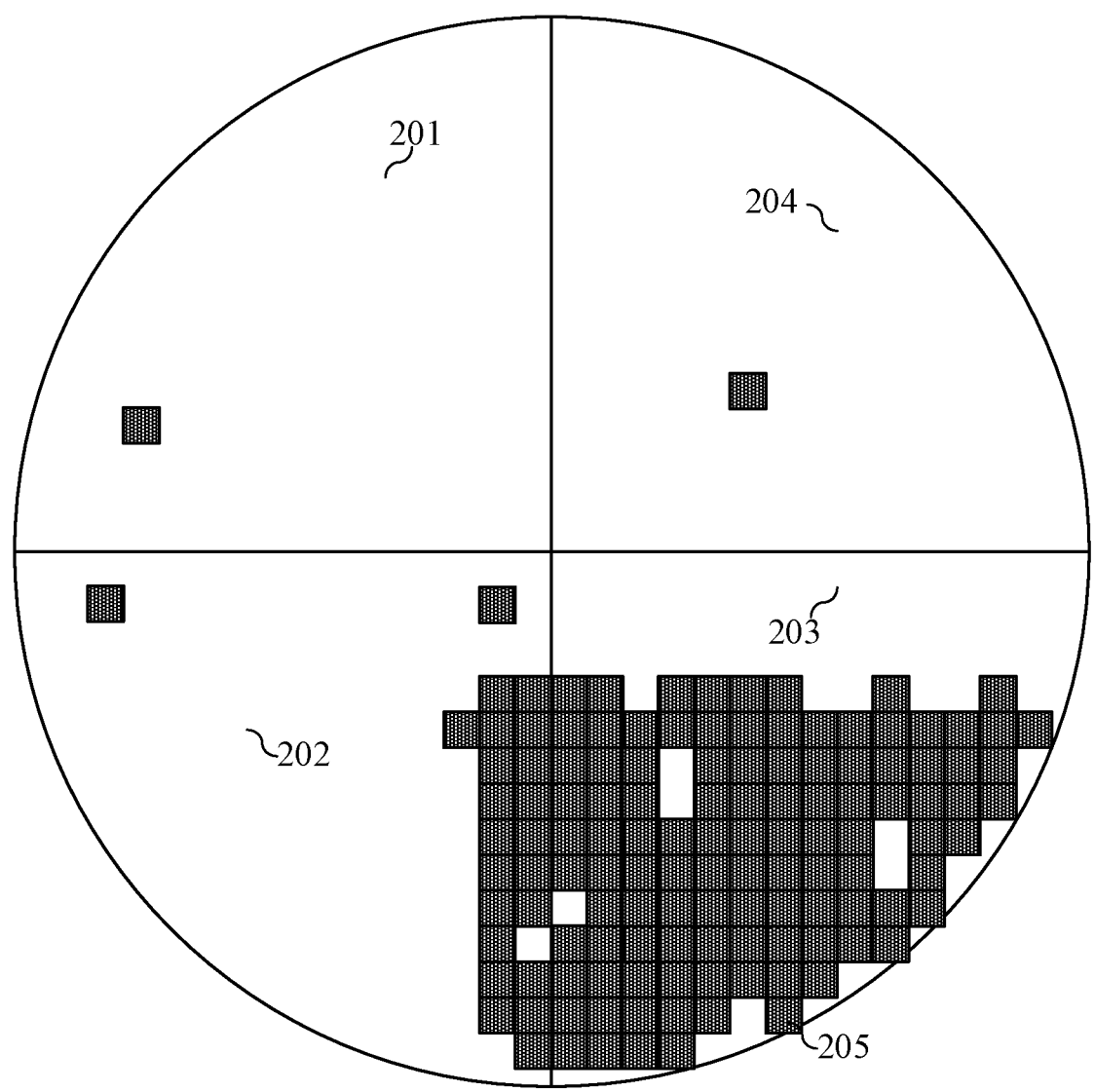
FIG. 6 illustrates a schematic diagram of a test result distribution diagram provided by an embodiment of the present disclosure.

Referring to FIG. 6, explanation of correlation judgment is carried out by taking the operation that the discrete point distribution diagram is divided into the first test region 201, the second test region 202, the third test region 203 and the fourth test region 204 in a crisscross manner as an example in the embodiments.

Discrete points 205 in the discrete point distribution diagram in a normal condition is in normal (Gaussian) distribution; the discrete points are randomly dispersed in the plurality of regions; for example, the discrete points 205 on the left of the first test region 201, the fourth test region 204 and the second test region 202 are normal; and the discrete points may be formed by the manufacturing process difference. However, the discrete points 205 on the right of the third test region 203 and the second test region 202 have a regional concentration phenomenon, which indicates that the discrete points in the test result distribution diagram have a relatively high correlation with the third test region 203 in the graphic distribution characteristics in the pre-set test region; that is, test parameter setting in the third test region 203 is wrong or wafer products have problems.

At Step 105, a test result of the wafer under test is obtained based on the correlation.

In the embodiments, after the test result of the wafer under test is obtained, if the test result of the wafer under test has no problem, the test continues to be carried out; if the test result of the wafer under test has a problem, a related manufacturing process engineer is notified to check whether set machine test parameters have a problem; if the set machine test parameters have a problem, modification can be carried out more rapidly compared with the related technology; if the set machine test parameters have no problem, it can be determined that a product problem occurs; and wafer products having the product problem are abandoned.

It should be noted that the testing method provided in the embodiments may be used for the detection machine for CP, and may also be used for the detection machine for FT.

Compared with related technology, in the embodiments of the present disclosure, the pre-set test region of the wafer under test is detected, to obtain the discrete point distribution diagram of the detection results of the plurality of chips in the wafer under test. The discrete point distribution diagram is divided into a plurality of test regions based on the graphic distribution characteristics in the pre-set region; furthermore, the test result distribution diagram in each test region is obtained; then, a test result of the wafer under test is obtained according to the correlation between the test result distribution diagram and the graphic distribution characteristics in the pre-set test region; the test result of the wafer under test is obtained based on the correlation obtained by mechanical detection; and the error and timeliness problem generated by the current identification are avoided. Moreover, the test result of the wafer under test obtained by analysis on correlation between the test result distribution diagram and the graphic distribution characteristics in the pre-set test region have relatively high credibility.

The above division of steps is merely for clear description; the steps may be combined into one step, or some steps are decomposed into a plurality of steps while implementation; as long as the same logical relationship is included, it is within the protection scope of the disclosure; and addition of inconsequential modifications or introduction of inconsequential designs in the process, which may not change core designs of the process, are within the protection scope of the disclosure.

Another embodiment of the present disclosure relates to a testing system, which may include a wafer under test, a detection machine and a processing module. The detection machine is configured to detect the wafer under test based on a pre-set test region, obtain the detection results of a plurality of chips in the wafer under test, and upload the detection results to the processing module; the processing module is configured to obtain a discrete point distribution diagram of the detection results of the plurality of chips in the wafer under test, a discrete point in the discrete point distribution diagram being used for representing a position of an abnormal chip in the wafer under test; and the processing module is further configured to divide the discrete point distribution diagram into a plurality of test regions based on graphic distribution characteristics in the pre-set test region, obtain a test result distribution diagram, the test result distribution diagram being used for representing graphic characteristics of the discrete point distribution diagram, obtain a correlation between the test result distribution diagram and the graphic distribution characteristics in the pre-set test region, and obtain a test result of the wafer under test based on the correlation.

Figure 7:
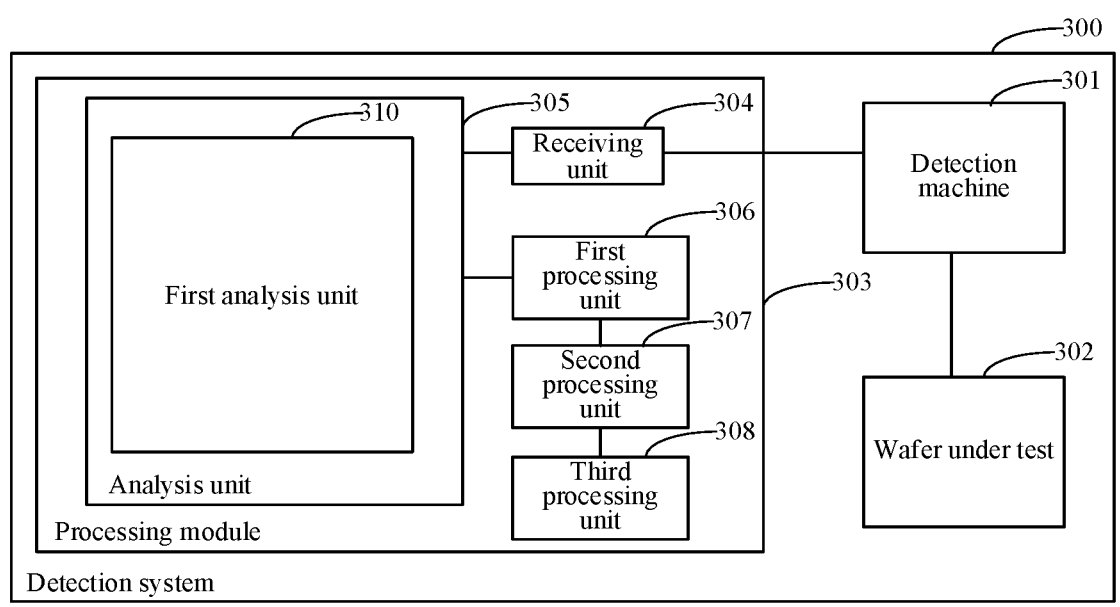
FIG. 7 illustrates a first schematic structural diagram of a testing system provided by another embodiment of the present disclosure
Figure 8:
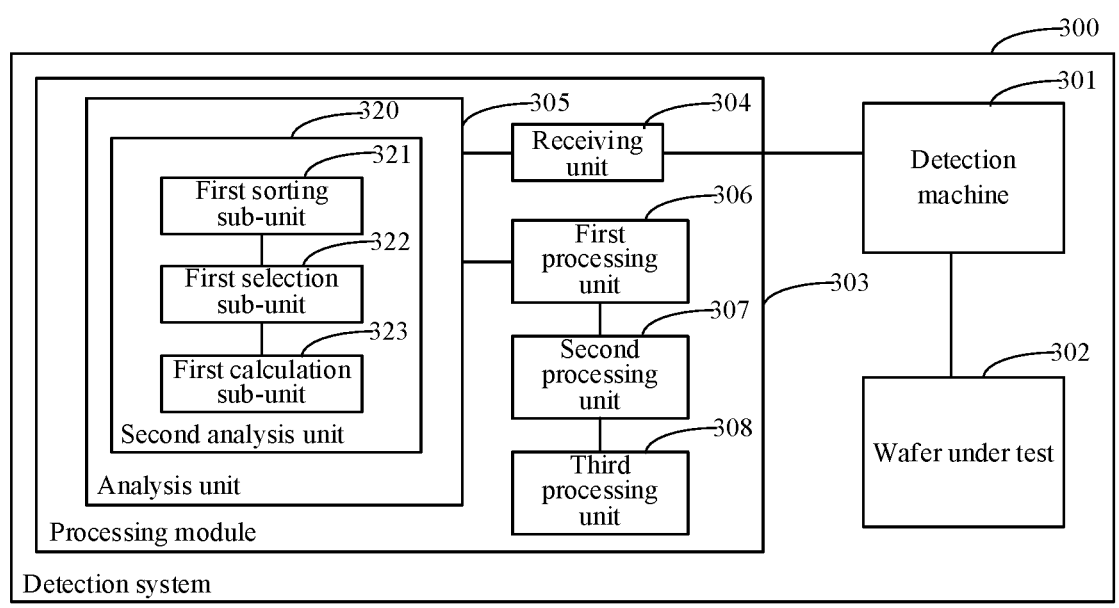
FIG. 8 illustrates a second schematic structural diagram of a testing system provided by another embodiment of the present disclosure
Figure 9:
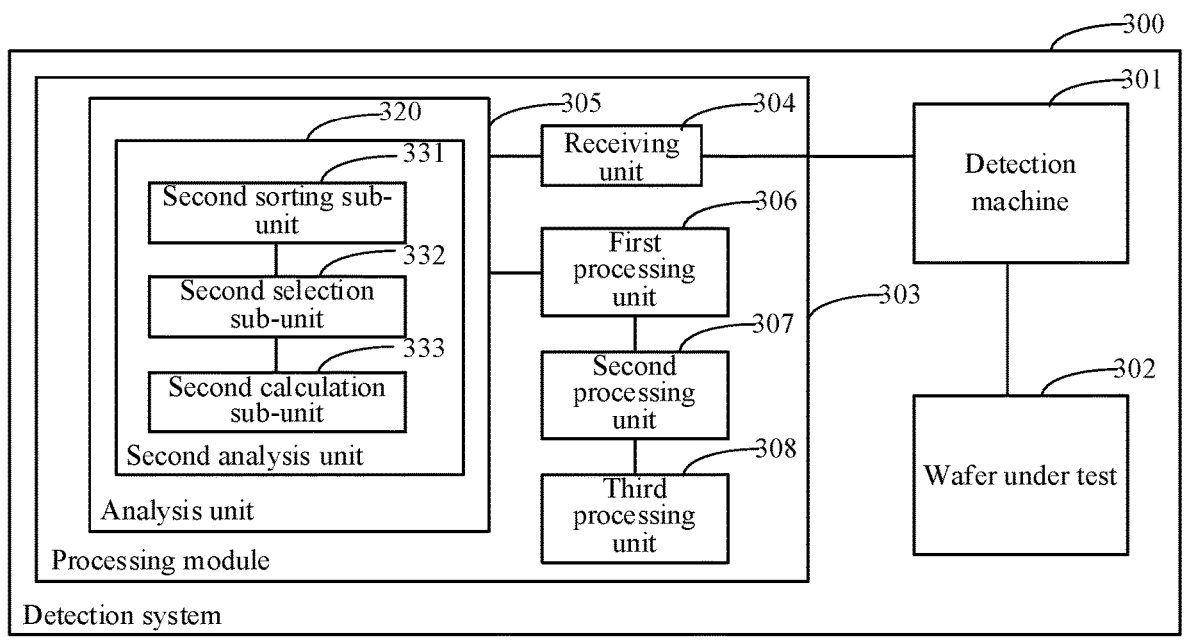
FIG. 9 illustrates a third schematic structural diagram of a testing system provided by another embodiment of the present disclosure.

Referring to FIG. 7 to FIG. 9, a testing system provided by the embodiments is described in detail in conjunction with the drawings below; and the parts same as or corresponding to the embodiments are not described in detail below.

Referring to FIG. 7, the testing system 300 may include a wafer under test 302, a detection machine 301 and a processing module 303 (i.e., a processing device). The detection machine 301 is configured to detect the wafer under test 302 based on a pre-set test region, obtain detection results of a plurality of chips in the wafer under test 302, and upload the detection results to the processing module 303; the processing module 303 is configured to obtain a discrete point distribution diagram of the detection results of the plurality of chips in the wafer under test 302, a discrete point in the discrete point distribution diagram being used for representing a position of an abnormal chip in the wafer under test 302; and the processing module 303 is further configured to divide the discrete point distribution diagram into a plurality of test regions based on graphic distribution characteristics in the pre-set test region, obtain a test result distribution diagram, the test result distribution diagram being used for representing graphic characteristics of the discrete point distribution diagram, obtain a correlation between the test result distribution diagram and the graphic distribution characteristics in the pre-set test region, and obtain a test result of the wafer under test 302 based on the correlation.

Specifically, the processing module 303 may include: a receiving unit 304 configured to receive the detection results; an analysis unit 305 connected with the receiving unit 304 and configured to obtain the discrete point distribution diagram of the detection results of the plurality of chips in the wafer under test 302; a first processing unit 306 connected with the analysis unit 305 and configured to divide the discrete point distribution diagram into a plurality of test regions based on the graphic distribution characteristics in the pre-set test region and obtain the test result distribution diagram; a second processing unit 307 connected with the first processing unit 306 and configured to obtain the correlation between the test result distribution diagram and the graphic distribution characteristics in the pre-set test region; and a third processing unit 308 connected with the second processing unit 307 and configured to obtain the test results of the wafer under test 302 based on the correlation.

The analysis unit 305 at least includes one of a first analysis unit and a second analysis unit. In one example, referring to FIG. 7, the analysis unit 305 may include the first analysis unit 310; when the detection results are of a category type, the detection results are used for indicating that the plurality of chips under test in the wafer under test 302 are normal chips or abnormal chips; and the first analysis unit 310 is configured to obtain a distribution diagram of positions of the abnormal chips in the wafer under test 302. In another embodiment, referring to FIG. 8 and FIG. 9, the analysis unit 305 may include the second analysis unit 320; when the detection results is of a data type, the detection results are used for indicating specific test numerical values of the plurality of chips under test in the wafer under test 302; and the second analysis unit 320 is configured to, for each of the chips to be tested in the wafer under test 302, obtain all specific test numerical values corresponding to the chip to be tested, judge whether the chip under test is a normal chip or an abnormal chip based on the specific test numerical values, and obtain a distribution diagram of positions of the abnormal chips in the wafer under test 302.

Specifically, referring to FIG. 8, the second analysis unit 320 may include a first sorting sub-unit 321, a first selection sub-unit 322, and a first calculation sub-unit 323. The first sorting sub-unit 321 is configured to arrange all the specific test numerical values in an ascending order. The first selection sub-unit 322 is configured to take any two detection results as a first detection result Q1 and a second detection result Q2 respectively from the ascending order arrangement, where the second detection result Q2 is greater than the first detection result Q1. The first calculation sub-unit 323 is configured to, when a specific test numerical value Q of all the specific test numerical values satisfies that: $Q \leq Q_1 - 1.5*Iqr$ or $Q \geq Q_2 + 1.5*Iqr$, take the specific test numerical value Q to be an abnormal test numerical value, wherein Iqr is a quartile deviation of the second detection result and the first detection result, and wherein the detection results corresponding to the chip under test at least including a pre-set number of abnormal test numerical values is taken as the discrete point.

Or, referring to FIG. 9, the second analysis unit 320 may include a second sorting sub-unit 331, a second selection sub-unit 332 and a second calculation sub-unit 333. The second sorting sub-unit 331 is configured to arrange all the specific test numerical values Q in a descending order. The second selection sub-unit 332 is configured to take any two detection results as a third detection result Q3 and a fourth detection result Q4 respectively from the descending order arrangement; moreover, the fourth detection result Q4 is greater than the third detection result Q3. The second calculation sub-unit 333 is configured to, when a specific test numerical value Q of all the specific test numerical values satisfies that: $Q \leq Q_4 - 1.5*Iqr$ or $Q \geq Q_3 + 1.5*Iqr$, take the specific test numerical value Q to be an abnormal test numerical value, wherein $Q_3$ is a specific test numerical value of the third detection result, $Q_4$ is a specific test numerical value of the fourth detection result, and Iqr is a quartile deviation of the third detection result and the fourth detection result, and wherein the detection results corresponding to the chip under test at least including a pre-set number of abnormal test numerical values is taken as the discrete point.

It should be noted that in other embodiments, the analysis unit may include both the first analysis unit and the second analysis unit, which can be used for the test results of a category type, and can also be used for the test results of a data type.

Compared with related technology, in the embodiments of the present disclosure, the processing module obtains the detection results on the wafer under test by the detection machine, analyzes the discrete point distribution diagram of the detection results of the plurality of chips in the wafer under test, divides the discrete point distribution diagram into a plurality of test regions based on the graphic distribution characteristics in the pre-set region, obtains the test result distribution diagram in each test region, and then obtains the test results of the wafer under test according to the correlation between the test result distribution diagram and the graphic distribution characteristics in the pre-set test region. The error and timeliness problems generated by the current identification are avoided; moreover, the test results of the wafer under test obtained by analysis on correlation between the test result distribution diagram and the graphic distribution characteristics in the pre-set test region have relatively high credibility.

It is worth mentioning that the plurality of modules related by the embodiments are logical modules; in practical application, one logical unit may be a physical unit, also be one part of a physical unit, and also be implemented by combination of a plurality of physical units, Moreover, in order to highlight innovative parts of the present disclosure, units not so closely related to the technical problems provided by the present disclosure are not introduced in the embodiments. However, it does not mean that other units do not exist in the embodiments.

Because the above embodiments mutually correspond to the embodiments, the embodiments may be mutually matched to be implemented with the above embodiments. The related technical details mentioned in the above embodiments still be effective in the embodiments; the technical effects achieved in the above embodiments may also be achieved in the embodiments; in order to reduce repetition, there is no more detailed description. Correspondingly, the related technical details mentioned in the embodiments may also be applied to the above embodiments.

It can be understood by those of ordinary skill in the art that the above various embodiments are specific embodiments for realizing the present disclosure; in actual application, various changes on the embodiments can be made in form and detail; and the spirit and the scope of the present disclosure are not deviated.

What is claimed is:

1. A testing method, comprising:
   detecting a wafer under test based on a pre-set test region, to obtain detection results of a plurality of chips in the wafer under test;
   obtaining a discrete point distribution diagram of the detection results of the plurality of chips in the wafer under test, a discrete point in the discrete point distribution diagram being used for representing a position of an abnormal chip in the wafer under test;
   dividing the discrete point distribution diagram into a plurality of test regions based on graphic distribution characteristics in the pre-set test region, and obtaining a test result distribution diagram, the test result distribution diagram being used for representing graphic characteristics of the discrete point distribution diagram;
   obtaining a correlation between the test result distribution diagram and the graphic distribution characteristics in the pre-set test region; and
   obtaining a test result of the wafer under test based on the correlation;
   wherein dividing the discrete point distribution diagram into the plurality of test regions based on the graphic distribution characteristics in the pre-set test region and obtaining the test result distribution diagram comprises:
   uniformly dividing the discrete point distribution diagram into a first test region, a second test region, a third test region and a fourth test region based on a crisscross region division manner; and
   determining numbers and position differences of the discrete points in the first test region, the second test region, the third test region and the fourth test region, to obtain the test result distribution diagram.

2. The testing method according to claim 1, wherein when the detection results are of a category type, the detection results indicate that the plurality of chips under test in the wafer under test are normal chips or abnormal chips;
   obtaining the discrete point distribution diagram of the detection results of the plurality of chips in the wafer under test comprises: obtaining a distribution diagram of positions of the abnormal chips in the wafer under test.

3. The testing method according to claim 1, wherein when the detection results are of a data type, the detection results indicate specific test numerical values of the plurality of chips under test in the wafer under test;
   obtaining the discrete point distribution diagram of the detection results of the plurality of chips in the wafer under test comprises: for each of the chips under test in the wafer under test, obtaining all the specific test numerical values corresponding to the chip under test, and judging whether the chip under test is a normal chip or an abnormal chip based on the specific test numerical values; and obtaining the distribution diagram of the positions of the abnormal chips in the wafer under test.

4. The testing method according to claim 3, wherein said judging whether the chip under test is the normal chip or the abnormal chip based on the specific test numerical values comprises:
   arranging all the specific test numerical values in an ascending order according to sizes of the specific test numerical values; and
   taking any two detection results as a first detection result and a second detection result respectively from the ascending order arrangement, wherein the second detection result is greater than the first detection result;
   when a specific test numerical value Q of all the specific test numerical values satisfies that: $Q \leq Q_1 - 1.5*Iqr$ or $Q \geq Q_2 + 1.5*Iqr$; taking the specific test numerical value Q to be an abnormal test numerical value, wherein $Q_1$ is a specific test numerical value of the first detection result, $Q_2$ is a specific test numerical value of the second detection result, and Iqr is a quartile deviation of the second detection result and the first detection result, and wherein the detection results corresponding to the chip under test at least including a pre-set number of abnormal test numerical values is taken as the discrete point.

5. The testing method according to claim 3, wherein said judging whether the chip under test is the normal chip or the abnormal chip based on the specific test numerical values comprises:

arranging all the specific test numerical values in a descending order according to sizes of the specific test numerical values; and taking any two detection results as a third detection result and a fourth detection result respectively from the descending order arrangement, wherein the fourth detection result is less than the third detection result;

when a specific test numerical value Q of all the specific test numerical values satisfies that: $Q \leq Q_4 - 1.5*Iqr$ or $Q \geq Q_3 + 1.5*Iqr$, taking the specific test numerical values Q to be an abnormal test numerical value, wherein $Q_3$ is a specific test numerical value of the third detection result, $Q_4$ is a specific test numerical value of the fourth detection result, and Iqr is a quartile deviation of the third detection result and the fourth detection result, and wherein the detection results corresponding to the chip under test at least including a pre-set number of abnormal test numerical values is taken as the discrete point.

6. The testing method according to claim 1, wherein said determining the numbers and the position differences of the discrete points in the first test region, the second test region, the third test region and the fourth test region comprises: determining the number differences of the discrete points in the first test region, the second test region, the third test region and the fourth test region in a chi-square test manner.

7. The testing method according to claim 1, wherein said obtaining the correlation between the test result distribution diagram and the graphic distribution characteristics in the pre-set test region comprises:
judging whether the discrete points in the test result distribution diagram have a same regional concentration phenomenon as the graphic distribution characteristics in the pre-set test region.

8. A testing system, comprising
a wafer under test, a detection machine and a processing device;
the detection machine is configured to detect the wafer under test based on a pre-set test region, obtain detection results of a plurality of chips in the wafer under test, and upload the detection results to the processing device;
the processing device is configured to obtain a discrete point distribution diagram of the detection results of the plurality of chips in the wafer under test, a discrete point in the discrete point distribution diagram being used for representing a position of an abnormal chip in the wafer under test; and
the processing device is further configured to divide the discrete point distribution diagram into a plurality of test regions based on graphic distribution characteristics in the pre-set test region, obtain a test result distribution diagram, the test result distribution diagram being used for representing graphic characteristics of the discrete point distribution diagram, and obtain a correlation between the test result distribution diagram and the graphic distribution characteristics in the pre-set test region, and obtain a test result of the wafer under test based on the correlation;
wherein the processing device is further configured to:
receive the detection results;
obtain the discrete point distribution diagram of the detection results of the plurality of chips in the wafer under test;
divide the discrete point distribution diagram into the plurality of test regions based on the graphic distribution characteristics in the pre-set test region, and obtain the test result distribution diagram;

obtain a correlation between the test result distribution diagram and the graphic distribution characteristics in the pre-set test region; and obtain a test result of the wafer under test based on the correlation;

wherein when the detection results are of a category type, the detection results indicate that the plurality of chips under test in the wafer under test are normal chips or abnormal chips;

and the processing device is configured to obtain a distribution diagram of positions of the abnormal chips in the wafer under test; or when the detection results are of a data type, the detection results indicate specific test numerical values of the plurality of chips under test in the wafer under test; and the processing device is configured to, for each of the chips under test in the wafer under test, obtain all the specific test numerical values corresponding to the chip under test, and judge whether the chip under test is a normal chip or an abnormal chip based on the specific test numerical values; and obtain the distribution diagram of the positions of the abnormal chips in the wafer under test;

wherein the processing device is further configured to:

arrange all the specific test numerical values in an ascending order according to sizes of the specific test numerical values;

take any two detection results as a first detection result and a second detection result respectively from the ascending order arrangement, wherein the second detection result is greater than the first detection result; and when a specific test numerical value Q of all the specific test numerical values satisfies that: $Q \leq Q_1 - 1.5*Iqr$ or $Q \geq Q_2 + 1.5*Iqr$, take the specific test numerical value Q to be an abnormal test numerical value, wherein $Q_1$ is a specific test numerical value of the first detection result, $Q_2$ is a specific test numerical value of the second detection result, and Iqr is a quartile deviation of the second detection result and the first detection result, and wherein the detection results corresponding to the chip under test at least including a pre-set number of abnormal test numerical values is taken as the discrete point.

9. A testing method, comprising:
detecting a wafer under test based on a pre-set test region, to obtain detection results of a plurality of chips in the wafer under test;
obtaining a discrete point distribution diagram of the detection results of the plurality of chips in the wafer under test, a discrete point in the discrete point distribution diagram being used for representing a position of an abnormal chip in the wafer under test;
dividing the discrete point distribution diagram into a plurality of test regions based on graphic distribution characteristics in the pre-set test region, and obtaining a test result distribution diagram, the test result distribution diagram being used for representing graphic characteristics of the discrete point distribution diagram;
obtaining a correlation between the test result distribution diagram and the graphic distribution characteristics in the pre-set test region; and obtaining a test result of the wafer under test based on the correlation;

wherein said dividing the discrete point distribution diagram into the plurality of test regions based on the graphic distribution characteristics in the pre-set test region and obtaining the test result distribution diagram comprises:

uniformly dividing the discrete point distribution diagram into a first test region, a second test region, a third test region and a fourth test region based on a concentric ring region division manner; and determining numbers and position differences of the discrete points in the first test region, the second test region, the third test region and the fourth test region, to obtain the test result distribution diagram.

* * * * *